United States Patent
Zhang et al.

(10) Patent No.: US 8,880,965 B2
(45) Date of Patent: Nov. 4, 2014

(54) LOW POWER SCAN FLIP-FLOP CELL

(71) Applicants: Wanggen Zhang, Suzhou (CN); Sian Lu, Tianjin (CN); Shayan Zhang, Tianjin (CN)

(72) Inventors: Wanggen Zhang, Suzhou (CN); Sian Lu, Tianjin (CN); Shayan Zhang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 97 days.

(21) Appl. No.: 13/682,749

(22) Filed: Nov. 21, 2012

(65) Prior Publication Data

US 2014/0040688 A1    Feb. 6, 2014

(30) Foreign Application Priority Data

Aug. 6, 2012 (CN) .......................... 2012 1 0401167

(51) Int. Cl.
*G01R 31/28* (2006.01)

(52) U.S. Cl.
USPC ........................... 714/726; 714/724; 714/727

(58) Field of Classification Search
CPC ............................................... G01R 31/328541
USPC ........................................ 714/726, 727, 724
See application file for complete search history.

(56) References Cited

U.S. PATENT DOCUMENTS

| | | | | | |
|---|---|---|---|---|---|
| 5,805,197 | A | * | 9/1998 | Fleming et al. | 347/237 |
| 5,859,657 | A | * | 1/1999 | Donahue et al. | 347/237 |
| 7,278,074 | B2 | * | 10/2007 | Mitra et al. | 714/724 |
| 7,949,971 | B2 | * | 5/2011 | Ortiz et al. | 716/104 |
| 2001/0052096 | A1 | | 12/2001 | Huijbregts | |
| 2010/0162058 | A1 | | 6/2010 | Brown | |

OTHER PUBLICATIONS

Nitin Parimi and Xiaoling Sun, "Design of a Low-Power D Flip-Flop for Test-Per-Scan Circuits", CCGEI 2004, Niagra Falls, May 2004, pp. 0777-0780.

* cited by examiner

*Primary Examiner* — Fritz Alphonse
(74) *Attorney, Agent, or Firm* — Charles Bergere (57) ABSTRACT

A low power scan flip-flop cell includes a multiplexer, a master latch, a scan slave latch and a data slave latch. The master latch is connected to the multiplexer, and used for generating a first latch signal. The scan slave latch is connected to the master latch, and generates a scan output (SO) signal. The data slave latch is connected to the master latch, and generates a Q output depending on a scan enable (SE) input signal and the first latch signal. The Q output is maintained at a predetermined level during scan mode, which eliminates unnecessary switching of combinational logic connected to the scan flip-flop cell and thus reduces power consumption.

16 Claims, 9 Drawing Sheets

LOW POWER SCAN FLIP-FLOP CELL

BACKGROUND OF THE INVENTION

The present invention relates to testing integrated circuits and, more particularly, to a low power scan flip-flop cell.

Scan chains comprise a plurality of interconnected scan flip-flops and are used to obtain access to internal nodes of an integrated circuit (IC) to simplify testing of the IC by passing test data through the flip-flops. The scan flip-flop is configured to operate in one of two modes, functional mode and scan mode.

When the scan enable input of a scan flip-flop is set to logic low, the scan flip-flop is in the functional mode; when the scan enable input of the scan flip-flop is set to logic high, the scan flip-flop is in scan mode (in this example, the scan enable signal is high active). For a full scan design, during scan testing, all of the flip-flops and all of the combinational logic connected to the flip-flops, may be toggling at the same time, causing very high power consumption. This high power consumption is much greater than the power consumption in normal functional mode where only some of the combinational logic and flip-flops are toggling, and such high power consumption may exceed the circuit's power rating. Further, as IC chip density and speed increase, the scan shift power problem is exacerbated.

Therefore, there is a need for providing a low power scan flip-flop cell and scan chain to solve the above problems.

SUMMARY OF THE INVENTION

The present invention provides a low power scan flip-flop cell that includes a multiplexer, a master latch, a scan slave latch and a data slave latch. The multiplexer is used for receiving a data input (D) signal and a scan input (SI) signal, and generating a first data signal depending on a scan enable (SE) input signal. The master latch is connected to the multiplexer, and receives the first data signal and generates a first latch signal. The scan slave latch is connected to the master latch, and receives the first latch signal and generates a scan output (SO) signal. The data slave latch is connected to the master latch, and generates Q and QN output signals depending on the scan enable (SE) input signal and the first latch signal. The Q output signal is maintained at a predetermined level during a scan mode.

The present invention further provides a method for performing a scan test on an integrated circuit having a plurality of scan connected flip-flops. Each flip-flop has a master latch, a data slave latch, a scan slave latch, a scan enable signal input (SE), and each flip-flop has a scan mode and a functional mode. The method comprises the following steps: setting the scan enable input to a first logic state to put the flip-flop in the scan mode; maintaining the data slave latch at an existing logic state during the scan mode, where the existing logic state is a logic state before setting the scan enable input to the first logic state; receiving a scan input to the master latch as a first data signal; shifting the first data signal from the master latch to the scan slave latch as a second data signal; and driving the second data signal from the scan slave latch to a first scan output of the flip-flop.

According to the invention, the low power scan flip-flop cell prevents the Q output signal from changing state during the scan shift operation to eliminate unnecessary switching of the combinational logic that is outside of the scan chain and thus, reduce unnecessary power consumption. The scan flip-flop cell of the present invention is compatible with a standard library flip-flop.

BRIEF DESCRIPTION OF THE DRAWING

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

Figure 1:
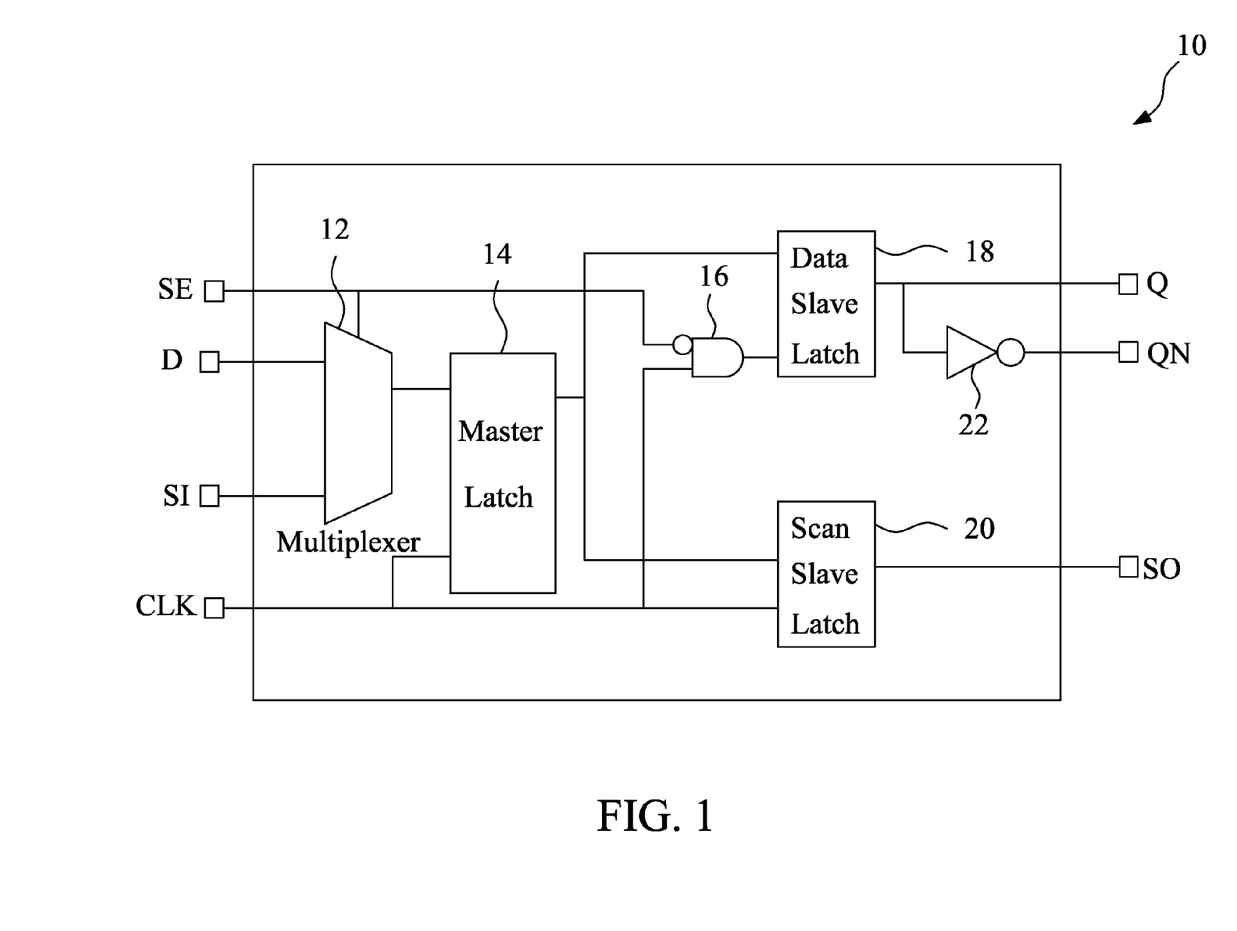
FIG. 1 is a schematic block diagram of a low power scan flip-flop cell in accordance with a first embodiment of the present invention.

Referring now to FIG. 1, a schematic block diagram of a low power scan flip-flop cell 10 in accordance with a first embodiment of the present invention is shown. The scan flip-flop cell 10 includes a multiplexer 12, a master latch 14, a first logic gate 16, a data slave latch 18, a scan slave latch 20, and a second logic gate 22.

The multiplexer 12 receives as inputs a data input (D) signal and a scan input (SI) signal, and outputs a first data signal depending on a scan enable (SE) input signal. The master latch 14 is connected to the multiplexer 12 and receives the first data signal at a data input and a clock signal (CLK) at a clock input, and outputs a first latch signal. The scan slave latch 20 is connected to the master latch 14, and receives the first latch signal at a data input and generates a scan output (SO) signal. The CLK signal also is input to the scan slave latch 20 at its clock input.

In this embodiment, the first logic gate 16 comprises an AND gate that receives as inputs an inverted scan enable (SE)

signal and the CLK signal, and generates as an output a first control signal. The output of the AND gate is connected to a clock input of the data slave latch 18. The data slave latch 18 receives the first latch signal from the master latch 14 at its data input, and generates a Q output. The Q output is input to the second logic gate 22, which in this embodiment is an inverter, and the second logic gate generates a QN output (i.e., Not Q).

In this embodiment, when the scan flip-flop cell 10 is in a scan mode, the SE signal is at logical high, then the inverted SE signal is at logical low and thus, the first control signal output by the AND gate 16 is logical low. Therefore, in scan mode, the Q and QN output signals of the data slave latch 18 are not toggled regardless of the value of the first latch signal. That is, the Q output is maintained at a predetermined level during the scan mode. The predetermined level is the level as that of a previous Q output level generated before the scan flip-flop cell 10 is switched to the scan mode. If the previous Q output level is logic low, then the predetermined level is logic low. If the previous Q output level is logic high, then the predetermined level is logic high. The scan slave latch 20 generates the SO signal based on the first latch signal from the master latch 14 and the CLK signal. When the scan flip-flop cell 10 is in a functional mode, the SE signal is at logical low, the inverted SE signal is at logical high, so the first control signal generated by the AND gate 16 is the same as the CLK signal. Therefore, the data slave latch 18 provides the Q output based on the first latch signal from the master latch 14 and the CLK signal.

Accordingly, the operation of the scan flip-flop cell 10 is not altered when it operates in the functional mode. However, when the scan flip-flop cell 10 is operating in the scan mode, the Q and QN outputs are maintained at a predetermined level (they do not toggle) and thus the Q and QN outputs do not cause any combinational logic that receives these output signals to toggle. In this manner, unwanted power dissipation is prevented during scan testing.

Figure 2:
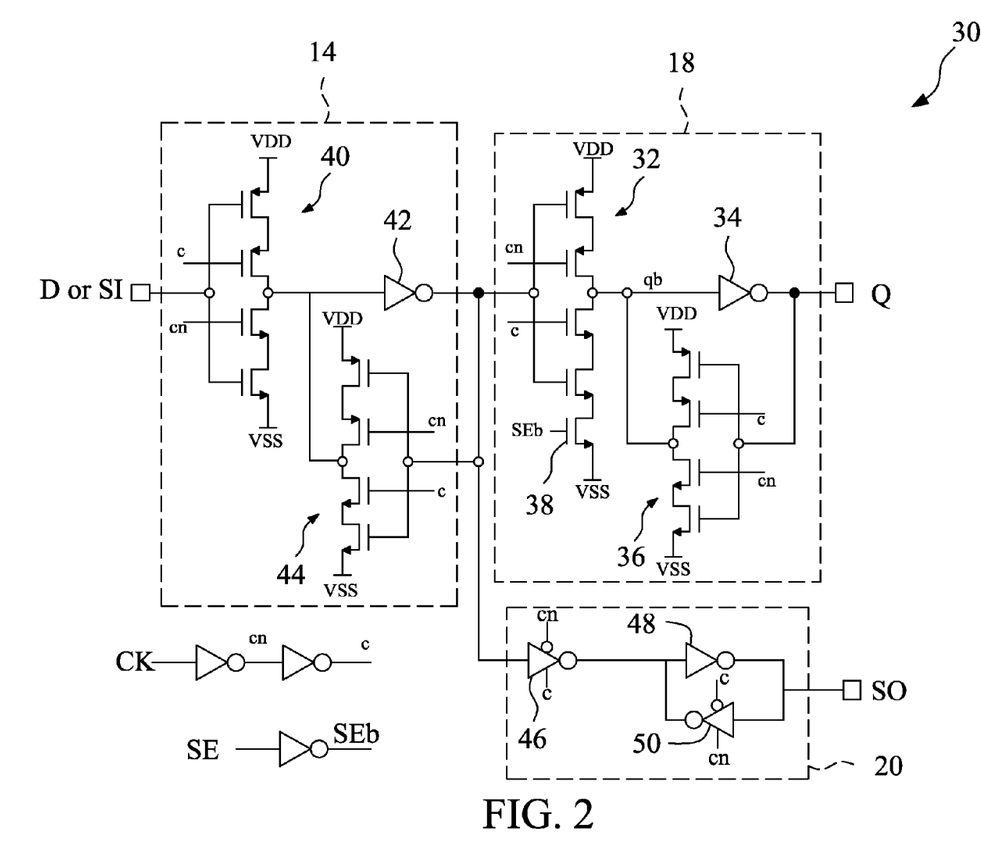
FIG. 2 is a schematic circuit diagram of a low power scan flip-flop cell in accordance with a second embodiment of the present invention.

Referring to FIG. 2, a scan flip-flop cell 30 includes a multiplexer (not shown in FIG. 2), a master latch 14, a data slave latch 18, and a scan slave latch 20.

The data slave latch 18 includes a first tri-state inverter 32, a first normal inverter 34, a second tri-state inverter 36 and a first transistor 38. The first normal inverter 34 and the second tri-state inverter 36 are connected in a loop. The first tri-state inverter 32 and the first transistor 38 are connected in series between a power supply (VDD) and ground (VSS). The first tri-state inverter 32 receives the first latch signal from the master latch 14 and generates a second data signal qb at a first connection node located between an input of the first normal inverter 34 and an output of the second tri-state inverter 36. The Q output is generated at a second connection node located between an output of the first normal inverter 34 and an input of the second tri-state inverter 36. In this embodiment, the first and second tri-state inverters 32, 36 each include four series connected transistors between power supply (VDD) and ground (VSS), and are respectively controlled by the clock signal (c) and an inverted clock signal (cn). The inverted clock signal cn may be generated with an inverter that receives a clock signal (CLK) and the clock signal (c) may be generated by an inverter connected in series with the inverter that generates the inverted clock signal, as shown in FIG. 2.

The first transistor 38 has a drain connected to the first tri-state inverter 32, a source connected to ground VSS, and a gate controlled by an inverted scan enable (SE) signal. In this example, the first transistor 38 is an NMOSFET.

The master latch 14 includes a third tri-state inverter 40, a second normal inverter 42 and a fourth tri-state inverter 44. The second normal inverter 42 and fourth tri-state inverter 46 are connected in a loop. The third tri-state inverter 40 receives the first data signal (D or SI) from the multiplexer 12 and generates a third data signal at a connection node located between an input of the second normal inverter 42 and output of the fourth tri-state inverter 44. The first latch signal output by the master latch 14 is generated at a connection node located between an output of the second normal inverter 42 and an input of the fourth tri-state inverter 44. The first latch signal is provided to both the data slave latch 18 and the scan slave latch 20. In this embodiment, the third and fourth inverters 40, 44 each comprise four series connected transistors between the power supply node (VDD) and ground (VSS), and are respectively controlled by the clock (c) and inverted clock (cn) signals.

The scan slave latch 20 includes a fifth tri-state inverter 46, a third normal inverter 48 and a sixth tri-state inverter 50. The third normal inverter 48 and sixth tri-state inverter 50 are connected in a loop, with the output of the third normal inverter 48 being connected to the input of the sixth tri-state inverter 50. The fifth tri-state inverter 46 receives as an input the first latch signal and provides an output at a connection node located between the input of the third normal inverter 48 and the output of the sixth tri-state inverter 50. The scan output (SO) signal is provided at a connection node located between the output of the third normal inverter 48 and the input of the sixth tri-state inverter 50. The fifth tri-state inverter 46 and the sixth tri-state inverter 50 are respectively controlled by the clock (c) and inverted clock (cn) signals.

Figure 4A:
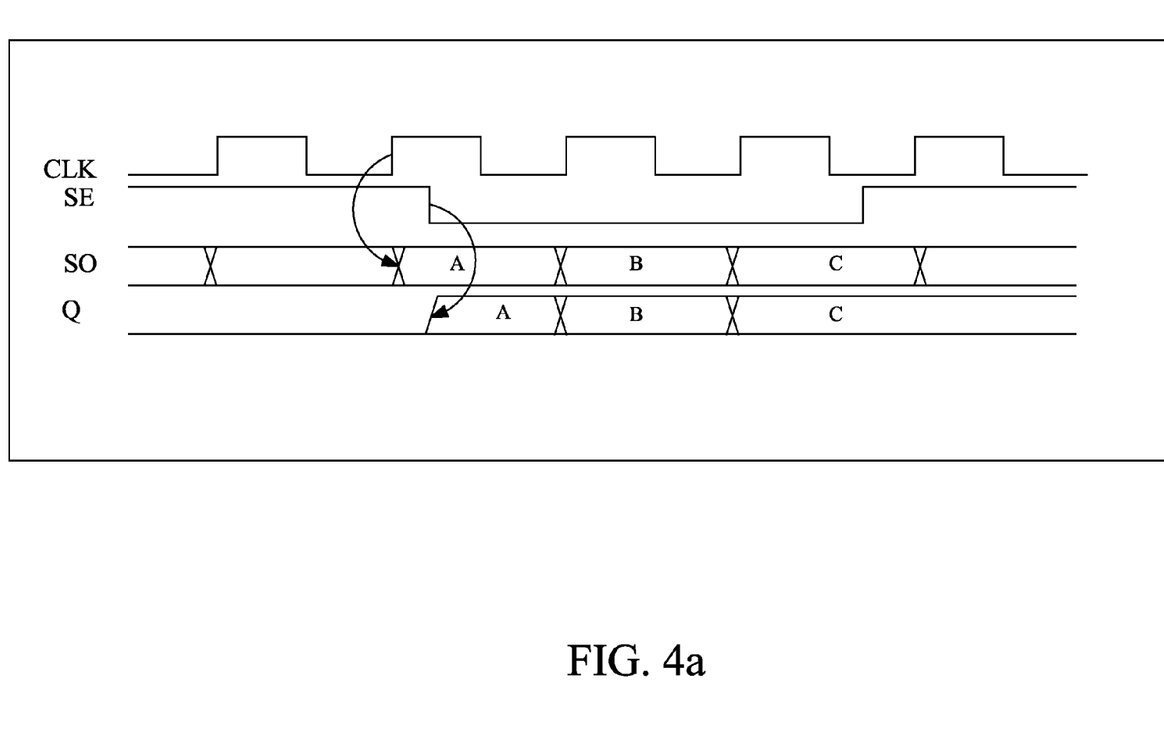
FIG. 4a is a timing diagram illustrating the cycles that are exercised during the scan and functional modes in accordance with the second embodiment of the present invention.

Referring to the timing diagram shown in FIG. 4a, when the scan flip-flop cell 30 is in scan mode, the SE signal is logical high and the inverted scan enable (SEb) signal is a logical low. Therefore, the first transistor 38 is switched off during the scan mode. Accordingly, the first tri-state inverter 32 is partially switched off. That is, "qb" generated at the first connection node will not toggle along with the first latch signal from the master latch 14, it may change from 0 to 1 when the first latch signal from the master latch 14 is 0 and original qb is 0, once qb is logical high it will not toggle again until it exits from scan mode. Accordingly, the Q output signal is maintained at logical low once it goes low during scan mode. The Q output will be held at logic low once it is at logic low during scan mode. Thus, any combinational logic receiving the Q output signal of the flip-flop cell 30 will only toggle once, at most.

When the scan flip-flop cell 30 is in functional mode, the SE signal is at a logical low and the inverted scan enable (SEb) signal is at a logical high. Therefore, the first transistor 38 is switched on in functional mode. The first tri-state inverter 32 operates under the control of the clock signal. That is, the data slave latch 18 operates in a normal state, outputting the Q and QN signals based on the first latch signal from the master latch 14 and the clock signal.

Figure 3:
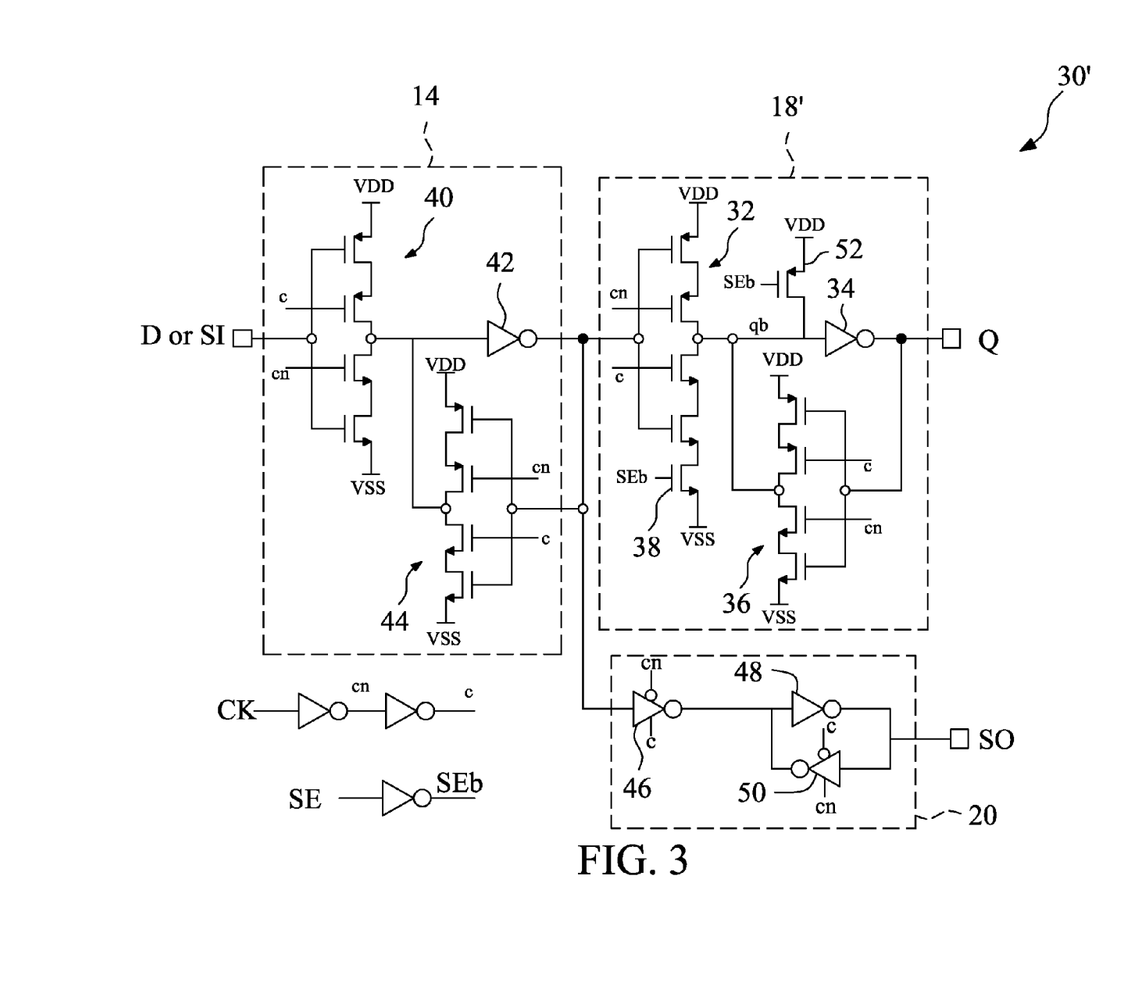
FIG. 3 is a schematic circuit diagram of a lower power scan flip-flop cell in accordance with a third embodiment of the present invention.

Referring to FIG. 3, a third embodiment of a scan flip-flop cell 30' is shown. The difference between the second embodiment flip-flop cell 30 and the third embodiment flip-flop cell 30' is that in the third embodiment, the data slave latch 18' includes a second transistor 52 coupled between the power supply VDD and the first connection node (where signal "qb" is generated). The second transistor 52 has a source connected to the power supply VDD, a drain connected to the first connection node, and a gate controlled by an inverted scan enable (SEb) input signal. In this embodiment, the second transistor 52 is a PMOSFET.

Figure 4B:
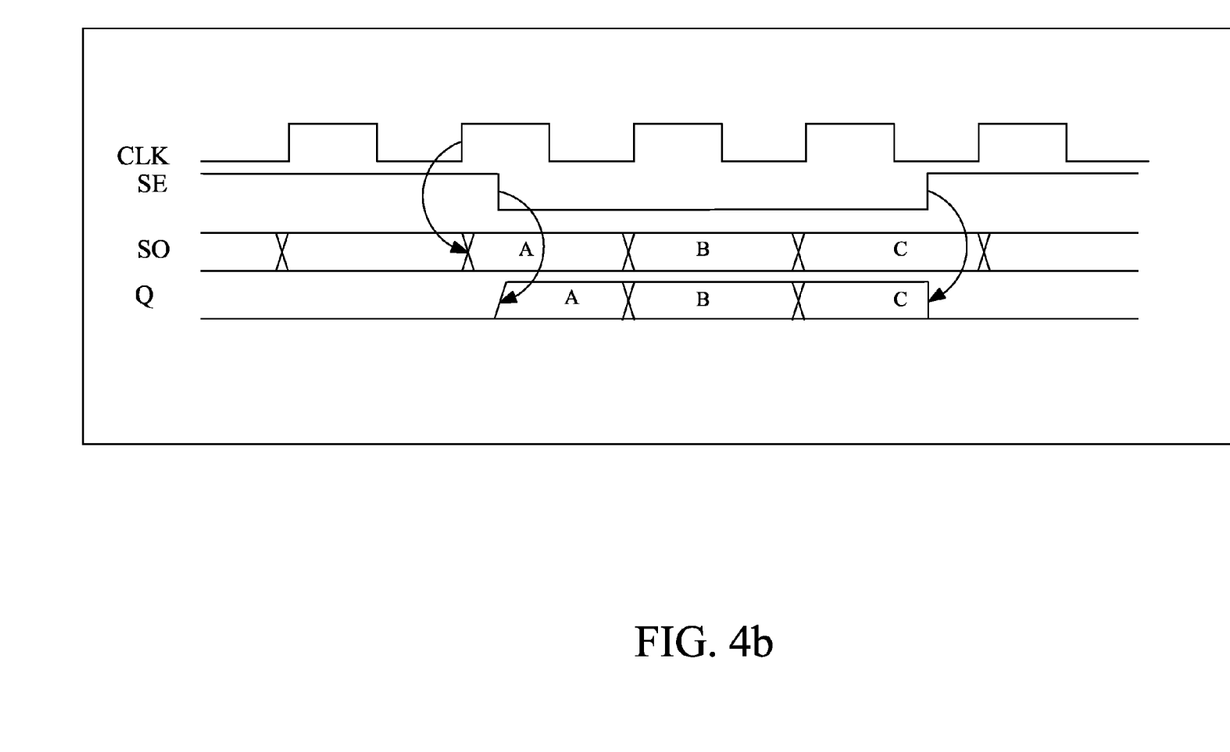
FIG. 4b is a timing diagram illustrating the cycles that are exercised during the scan and functional modes in accordance with the third embodiment of the present invention.

Referring to FIG. 4b, when the scan flip-flop cell 30' is in scan mode, the SE signal is at logic high and the inverted scan enable (SEb) signal is at logic low. Therefore, the second transistor 52 is switched on. The signal "qb" at the first connection node goes high during scan shift so as to keep the Q output signal at a logic low state. However, when the scan flip-flop cell 30' is in functional mode, the second transistor 52 is switched off and so does not hold the "qb" signal high. Meanwhile, as discussed above with reference to the second embodiment, the first transistor 38 is switched on and the first tri-state inverter 32 operates under the control of the clock signal during the functional mode. Therefore, the data slave latch 18' will output the Q and QN signals based on the first latch signal from the master latch 14 and the clock signal.

Figure 5:
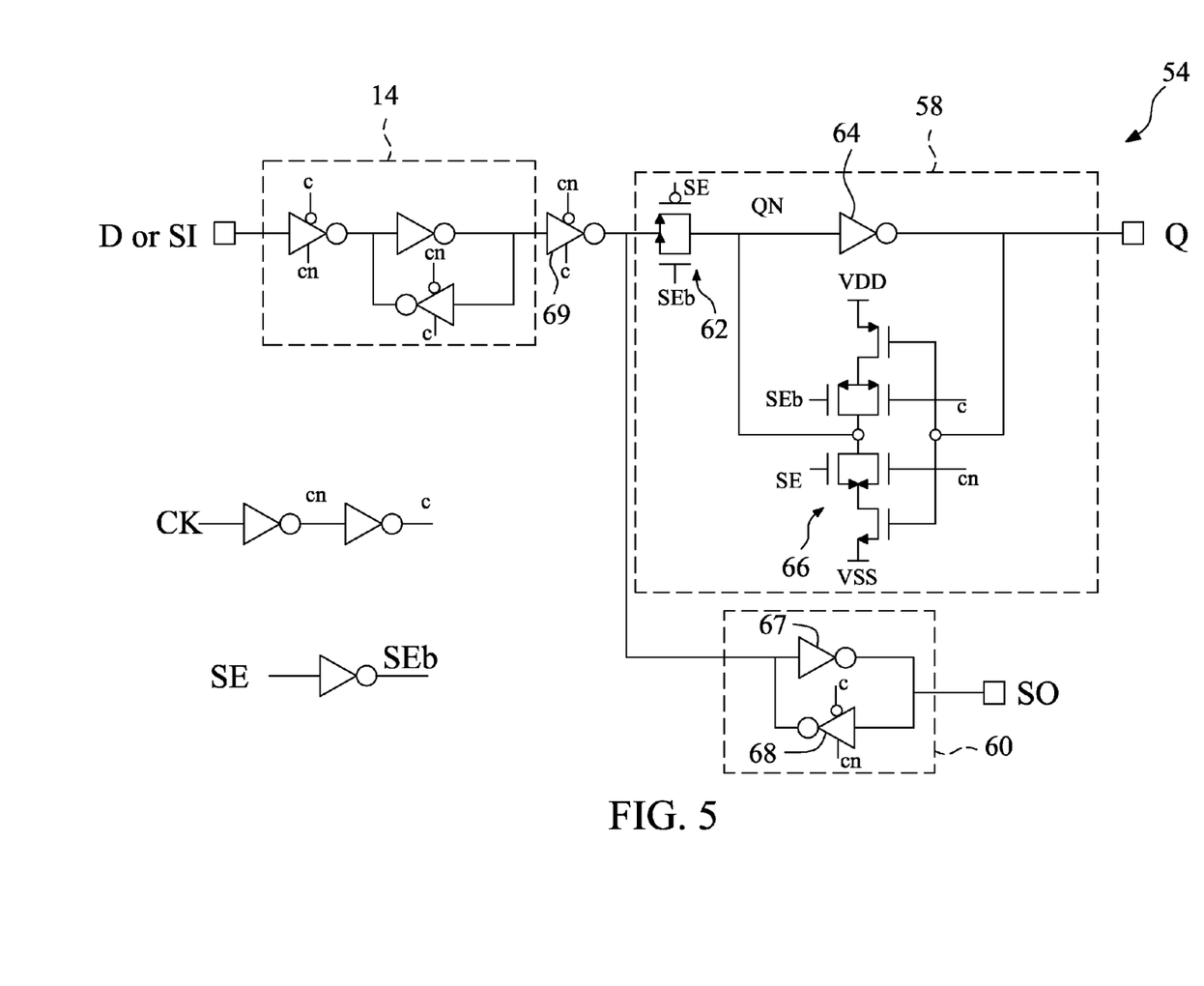
FIG. 5 is a schematic circuit diagram of a low power scan flip-flop cell in accordance with a fourth embodiment of the present invention.

FIG. 5 is a schematic circuit diagram of a low power scan flip-flop cell 54 in accordance with a fourth embodiment of the present invention. The scan flip-flop cell 54 includes a multiplexer (not shown), a master latch 14, a data slave latch 58, and a scan slave latch 60. In this embodiment, the master latch 14 is similar to the master latch 14 shown in FIGS. 2 and 3, so a detailed description thereof is not repeated.

The data slave latch 58 includes a first transmission gate 62, a fourth normal inverter 64 and a seventh tri-state inverter 66. The fourth normal inverter 64 and seventh tri-state inverter 66 are connected in a loop. The first transmission gate 62 receives the first latch signal from the master latch 14 as an input and has an output connected to a first connection node (QN) located between an input of the fourth normal inverter 64 and an output of the seventh tri-state inverter 66. The Q output is generated at a second connection node located between an output of the fourth normal inverter 64 and an input of the seventh tri-state inverter 66. The first transmission gate 62 is controlled by the inverted SE signal (SEb), and the seventh tri-state inverter 66 is controlled by both the clock signal and the SE signal. In this embodiment, the seventh tri-state inverter 66 comprises six transistors and is controlled by both the SE and clock signals.

The scan slave latch 60 includes a fifth normal inverter 67 and an eighth tri-state inverter 68 connected in a loop with the fifth normal inverter 67. The fifth normal inverter 67 receives at its input the first latch signal and outputs the SO signal. The eighth tri-state inverter 68 is controlled by the inverted clock signal (cn).

In this example, the data slave latch 58 and the scan slave latch 60 receive the first latch signal generated by the master latch 14 by way of a ninth tri-state inverter 69, which is controlled by the clock signal (c).

Figure 6:
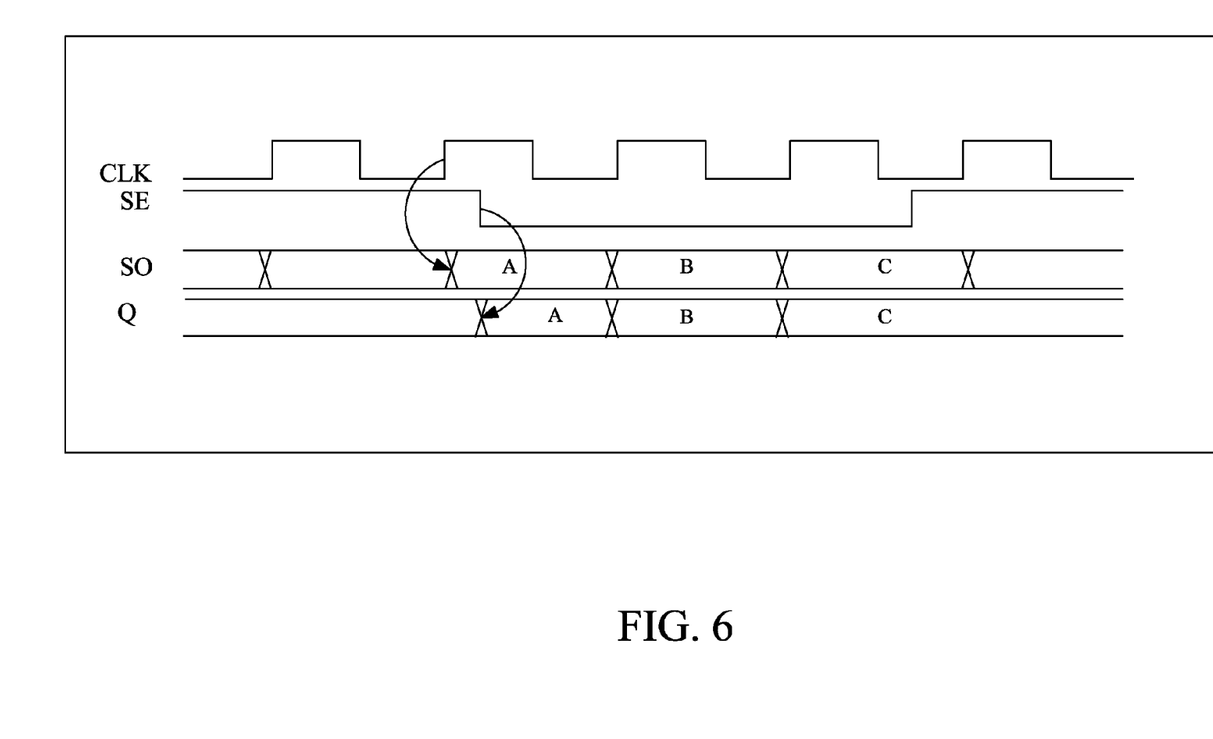
FIG. 6 is a timing diagram illustrating the cycles that are exercised during the scan and functional modes in accordance with the fourth embodiment of the present invention.

Referring to FIG. 6, when the scan flip-flop cell 54 is in scan mode, the SE signal is at logic high and the inverted scan enable (SEb) signal is at logical low. Accordingly, the first transmission gate 62 is switched off. Thus, the signal at the first connection node (QN) will not toggle along with the first latch signal. Therefore, the Q output signal maintains its previous state until the next capture. For example, if the previous level (C) is logic high, then the Q output stays at logic high; if the previous level (C) is logic low, then the Q output stays at logic low. When the scan flip-flop cell 54 is in functional mode, the SE signal is logic low and the inverted scan enable (SEb) signal is at logic high, so the first transmission gate 62 is switched on. Therefore, in functional mode, the data slave latch 58 outputs Q based on the first latch signal and the clock signal. In this example, the seventh tri-state inverter 66 is controlled by the SE signal, the inverted scan enable (SEb) signal, the clock signal (c) and the inverted clock signal (cn), so that the seventh tri-state inverter 66 can be kept on during scan shift mode, so Q output level will be kept.

Figure 7:
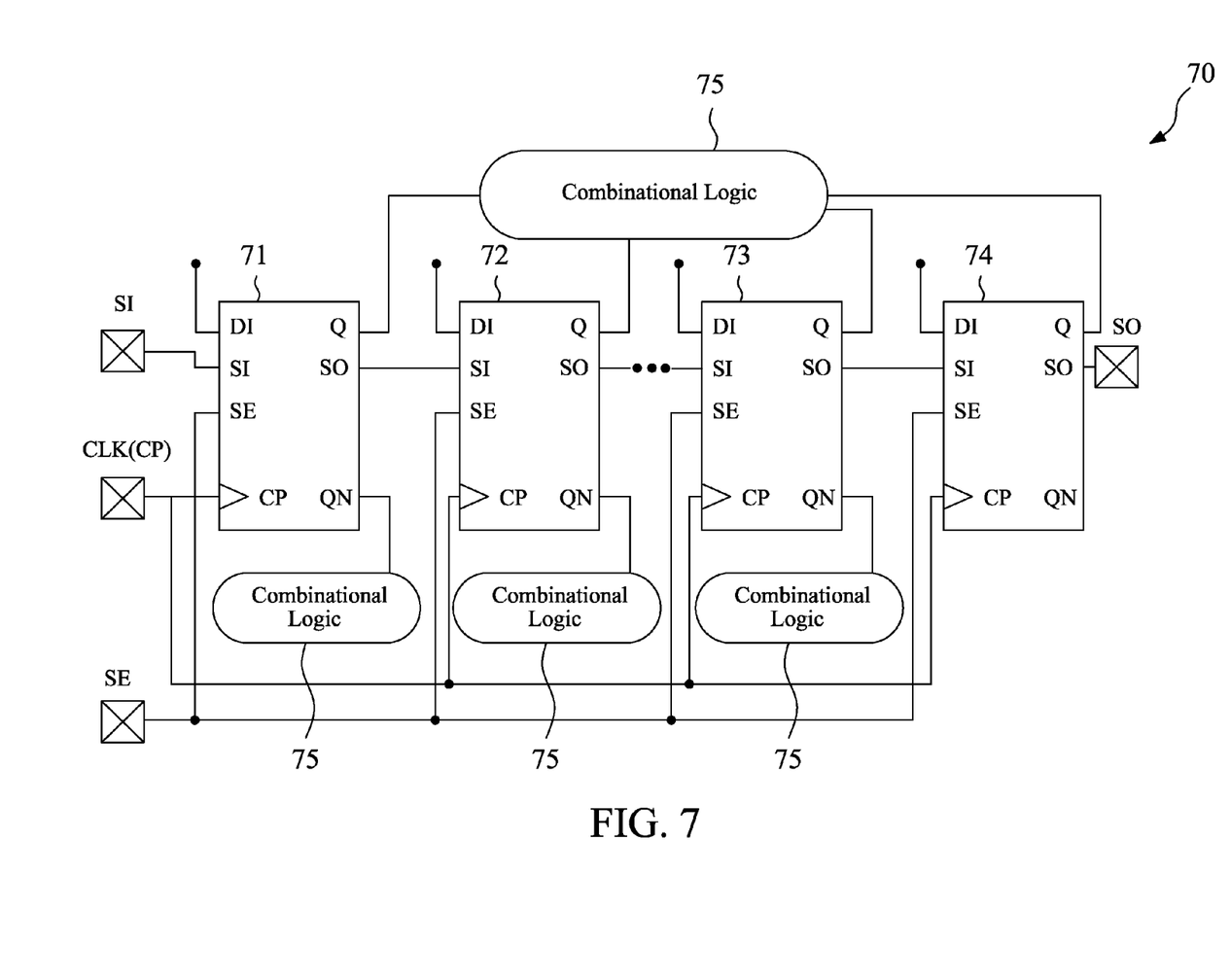
FIG. 7 is a schematic block diagram of a scan chain in accordance with one embodiment of the present invention.

FIG. 7 is a schematic block diagram of a scan chain 70 in accordance with one embodiment of the present invention. In this example, the scan chain 70 includes a scan input (SI) pin, a scan output (SO) pin, a system clock (CP), and a scan enable (SE) pin. The scan chain 70 includes a plurality of series connected low power scan flip-flop cells, for simplicity only four are shown, 71, 72, 73, 74. The low power scan flip-flop cells 71-74 are the same as those in the above embodiments, and therefore are not described in further detail. In this embodiment, the scan chain 70 includes a first flip-flop cell 71, first and second middle flip-flop cell 72, 73 and a last flip-flop cell 74. The first flip-flop cell 71 is configured to receive the scan input (SI) signal from the SI pin. The middle flip-flop cell 72 receives at its SI, the SO of the first flip-flop cell 71; the middle flip-flop cell 73 receives at its SI, the SO of the first middle flip-flop cell 72; and the last flip-flop cell 74 receives at its SI, the SO of the second middle flip-flop cell 73. All of the scan flip-flop cells 71-74 receive the SE signal and the CP signal, as shown in FIG. 7.

In the embodiment shown, a plurality of combinational logic blocks 75 are connected to the flip-flop cells 71-74. As is known in the art, combinational logic blocks may be connected to either or both of the Q and QN outputs of the flip-flop cells 71-74. Although the combinational logic blocks 75 are illustrated as distinct blocks, those skilled in the art will readily appreciate that the combinational logic 75 is actually distributed throughout an integrated circuit that includes the exemplary scan chain 70. As stated above, when the scan flip-flop cell is in a scan mode, the Q output signal does not toggle (it is maintained at a predetermined level or logic low). Therefore, when scan shifting is performed in which a data pattern is rippled through the scan chain, none of the combinational logic 75 is caused to toggle because the Q and QN outputs do not toggle. Because the combinational logic 75 is not being toggled, unnecessary power consumption is avoided, power spikes can be avoided, and less heat is generated.

Figure 8:
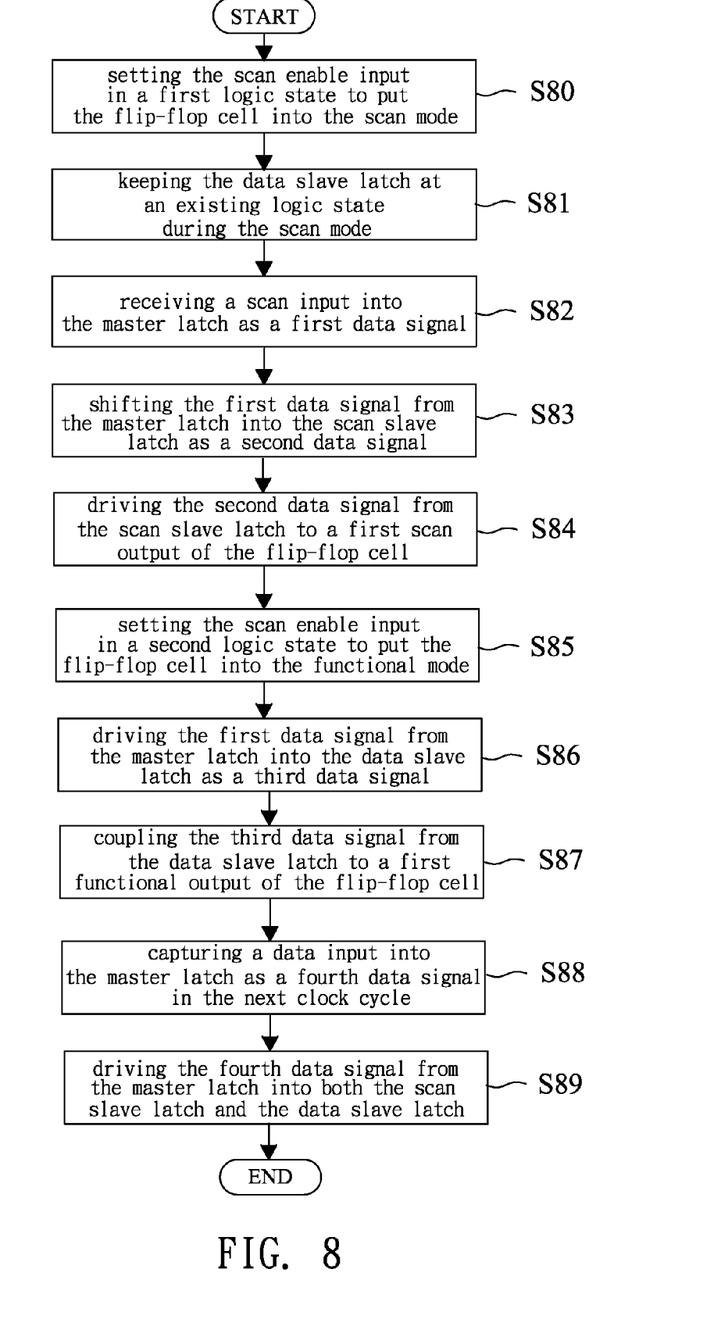
FIG. 8 is a flow chart of a scan test method in accordance with one embodiment of the present invention.

FIG. 8 is a flow chart of a scan test method in accordance with one embodiment of the present invention. The scan test method is performed on an integrated circuit (IC). The IC has a plurality of scan connected flip-flop cells as is known in the art. Referring to FIGS. 1 and 8, each flip-flop cell 10 has a master latch 14, a data slave latch 18, a scan slave latch 20, a scan enable signal input(SE), and each flip-flop cell has a scan mode and a functional mode.

At step S80, the scan enable input is set in a first logic state to put the flip-flop cell 10 into the scan mode. In this embodiment, the first logic state is logic high. At step S81, the data slave latch 18 is kept at an existing logic state during the scan mode. The existing logic state is a logic state before the scan enable input is set at the first logic state. In some embodiments, the logic state of the data slave latch is kept at a logic low level during the scan mode. Thus combinational logic connected to the flip-flop cell 10 will not be toggled during scan mode.

At step S82, the master latch 14 receives a scan input as a first data signal. At step S83, the first data signal is shifted from the master latch 14 to the scan slave latch 20 as a second data signal. At step S84, the second data signal is driven from the scan slave latch 20 to a first scan output of the flip-flop cell 10 so as to perform the scan test on the integrated circuit.

At step S85, the scan enable input is set to a second logic state to put the flip-flop cell 10 in the functional mode. In this embodiment, the second logic state is logical low. At step S86, the first data signal is driven from the master latch 14 to the data slave latch 18 as a third data signal. At step S87, the third data signal is coupled from the data slave latch 18 to a first functional output of the flip-flop cell 10 so the combinational logic is toggled during functional mode. At step S88, a data input is captured in the master latch 14 as a fourth data signal in the next clock cycle. At step S89, the fourth data signal is driven from the master latch 14 to both the scan slave latch 20 and the data slave latch 18. The fourth data signal is driven from the master latch 14 to the scan slave latch 20 as a fifth data signal, and then the fifth data signal is coupled from the scan slave latch 20 to the scan output of the flip-flop cell 10.

In any of the foregoing embodiments, the size of the scan slave latch can be small so that the scan flip-flop cell 10 can be compact. In addition, the scan slave latch can have a similar structure as the data slave latch to reduce the functional power of the scan flip-flop cell.

While various embodiments of the present invention have been illustrated and described, it will be clear that the present invention is not limited to these embodiments only. Moreover, although certain signals are described as either high or low active, one of skill in the art will understand that circuitry can be designed as either high or low active, so specifying a logic state in the above examples is just for explanatory purposes and is not to limit the inventive concept of the invention. Numerous modifications, changes, variations, substitutions, and equivalents will be apparent to those skilled in the art, without departing from the spirit and scope of the present invention, as described in the claims.

The invention claimed is:

1. A low power scan flip-flop cell operable in a functional mode and a scan mode, comprising:
    a multiplexer for receiving a data input (D) signal and a scan input (SI) signal, and generating a first data signal depending on a scan enable (SE) signal;
    a master latch, connected to the multiplexer, for receiving the first data signal and generating a first latch signal;
    a scan slave latch, connected to the master latch, for receiving the first latch signal and generating a scan output (SO) signal; and
    a data slave latch, connected to the master latch and receiving the first latch signal, for generating a Q output depending on the SE signal and the first latch signal, wherein the Q output is maintained at a predetermined level during the scan mode, and
    wherein the data slave latch comprises:
        a first tri-state inverter, a first normal inverter, a second tri-state inverter and a first transistor, wherein the first normal inverter and the second tri-state inverter are connected in a loop, and the first tri-state inverter and the first transistor are connected in series and disposed between a power supply node (VDD) and ground (VSS),
        wherein the first tri-state inverter receives the first latch signal and generates a second data signal (/Q) at a first connection node connected to an input of the first normal inverter and an output of the second tri-state inverter, and wherein the Q output is generated at a second connection node connected to an output of the first normal inverter and an input of the second tri-state inverter, and
        wherein the first and second tri-state inverters are controlled by a clock signal.

2. The flip-flop cell of claim 1, further comprising a first logic gate having an output connected to a clock input of the data slave latch, wherein the first logic gate receives an inverted SE input signal and a clock (CLK) signal and generates a first control signal that is input to the clock input of the data slave latch so that the Q output is maintained at a previous level during the scan mode.

3. The flip-flop cell of claim 2, wherein the first logic gate comprises an AND gate.

4. The flip-flop cell of claim 2, further comprising an inverter connected to the Q output of the data slave latch for generating a QN output signal.

5. The flip-flop cell of claim 1, wherein the first transistor has a drain connected to the first tri-state inverter, a source connected to VSS, and a gate controlled by an inverted SE signal.

6. The flip-flop cell of claim 1, wherein the first transistor is an NMOSFET.

7. The flip-flop cell of claim 1, wherein the data slave latch further comprises a second transistor coupled between the power supply (VDD) and the first connection node, wherein the second transistor has a gate controlled by the inverted SE signal, and wherein the Q output is maintained at a logic low during the scan mode.

8. The flip-flop cell of claim 7, wherein the second transistor is a PMOSFET.

9. The flip-flop cell of claim 1, wherein the master latch comprises a third tri-state inverter, a second normal inverter and a fourth tri-state inverter, wherein the second normal inverter and the fourth inverter are connected in a loop, the third tri-state inverter receives the first data signal and generates a third data signal at a third connection node located at the input of the second normal inverter and the output of fourth tri-state inverter, and wherein the first latch signal is generated at an output of the second normal inverter.

10. The flip-flop cell of claim 9, wherein the third and fourth tri-state inverters are controlled by the clock signal.

11. The flip-flop cell of claim 9, wherein the scan slave latch comprises:
    a fifth tri-state inverter that receives the first latch signal;
    a third normal inverter; and
    a sixth tri-state inverter connected in a loop with the third normal inverter;
    wherein an output of the fifth tri-state inverter is connected to a fourth connection node at the input of the third normal inverter and the output of the sixth tri-state inverter,
    the SO signal is generated at a fifth connection node located at the output of the third normal inverter and the input of the sixth tri-state inverter, and
    the fifth and sixth tri-state inverters are controlled by the clock signal.

12. The flip-flop cell of claim 11, wherein the data slave latch comprises:
    a first transmission gate that receives the first latch signal;
    a fourth normal inverter having an input connected to an output of the first transmission gate; and
    a seventh tri-state inverter connected in a loop with the fourth normal inverter,
    wherein a sixth connection node is located between the input of the fourth normal inverter and the output of the seventh tri-state inverter, and a seventh connection node is located between the output of the fourth normal inverter and the input of the seventh tri-state inverter,
    wherein the Q output is generated at the sixth connection node, and
    wherein the first transmission gate is controlled by an inverted SE signal, and the seventh tri-state inverter is controlled by a clock signal and the SE signal.

13. The flip-flop cell of claim 12, wherein the scan slave latch comprises:
    a fifth normal inverter; and
    an eighth tri-state inverter connected in a loop with the fifth normal inverter, wherein an eighth connection node located between the input of the fifth normal inverter and the output of the eighth tri-state inverter receives the first latch signal, wherein the SO signal is generated at a ninth node located at the output of the fifth normal inverter, and wherein the eighth tri-state inverter is controlled by the clock signal.

14. The flip-flop cell of claim 13, further comprising:
a ninth tri-state inverter connected between an input of the first transmission gate of the data slave latch and the output of the master latch, wherein the ninth tri-state inverter is controlled by the clock signal.

15. A low power scan flip-flop cell operable in a functional mode and a scan mode, comprising:
a multiplexer for receiving a data input (D) signal and a scan input (SI) signal, and generating a first data signal depending on a scan enable (SE) signal;
a master latch, connected to the multiplexer, for receiving the first data signal and generating a first latch signal;
a scan slave latch, connected to the master latch, for receiving the first latch signal and generating a scan output (SO) signal; and
a data slave latch, connected to the master latch and receiving the first latch signal, for generating a Q output, wherein the Q output is maintained at a predetermined level during the scan mode, and
wherein the data slave latch comprises:
a first tri-state inverter,
a first normal inverter,
a second tri-state inverter connected in a loop with the first normal inverter,
a first transistor connected in series with the first tri-state inverter between a power supply (VDD) and ground (VSS),
wherein the first tri-state inverter receives the first latch signal and generates a first control signal (qb) at a first connection node located between the output of the first tri-state inverter and the input of the first normal inverter, wherein the Q output is generated at a second connection node located at the output of the first normal inverter and the input of the second tri-state inverter, wherein the first and second tri-state inverters are controlled by a clock signal, wherein the first transistor has a drain connected to the first tri-state inverter, a source connected to ground, and a gate controlled by an inverted SE signal, wherein the master latch comprises,
a third tri-state inverter, a second normal inverter and a fourth tri-state inverter connected in a loop with the second normal inverter, wherein the third tri-state inverter receives the first data signal and generates a third data signal at a node located at the input of the second normal inverter and the output of the fourth tri-state inverter, and wherein the first latch signal is generated at the output of the second normal inverter, and wherein the scan slave latch comprises,
a fifth tri-state inverter (46) that receives the first latch signal,
a third normal inverter, and
a sixth tri-state inverter connected in a loop with the third normal inverter,
wherein the output of the fifth tri-state inverter is connected to a node at the input of the third normal inverter and the output of the sixth tri-state inverter,
wherein the SO signal is generated at node located at the output of the third normal inverter and an input of the sixth tri-state inverter, and
wherein the fifth and sixth tri-state inverters are controlled by the clock signal.

16. The flip-flop cell of claim 15, wherein the data slave latch further comprises a second transistor coupled between the power supply and the first connection node, wherein the second transistor has a gate controlled by the inverted SE signal, and wherein the Q output is maintained at a logic low during the scan mode.

* * * * *